(12) United States Patent
Horikiri et al.

(10) Patent No.: US 10,497,855 B2
(45) Date of Patent: Dec. 3, 2019

(54) FERROELECTRIC THIN-FILM LAMINATED SUBSTRATE, FERROELECTRIC THIN-FILM DEVICE, AND MANUFACTURING METHOD OF FERROELECTRIC THIN-FILM LAMINATED SUBSTRATE

(71) Applicant: SUMITOMO CHEMICAL COMPANY, LIMITED, Tokyo (JP)

(72) Inventors: Fumimasa Horikiri, Hitachi (JP); Kenji Shibata, Hitachi (JP); Kazutoshi Watanabe, Hitachi (JP); Kazufumi Suenaga, Tokyo (JP); Hiroyuki Endo, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 79 days.

(21) Appl. No.: 15/561,392

(22) PCT Filed: Mar. 2, 2016

(86) PCT No.: PCT/JP2016/056420
§ 371 (c)(1),
(2) Date: Sep. 25, 2017

(87) PCT Pub. No.: WO2016/152419
PCT Pub. Date: Sep. 29, 2016

(65) Prior Publication Data
US 2018/0114896 A1   Apr. 26, 2018

(30) Foreign Application Priority Data

Mar. 26, 2015   (JP) .................................. 2015-064704

(51) Int. Cl.
| | |
|---|---|
| *H01L 41/187* | (2006.01) |
| *C01G 33/00* | (2006.01) |
| *H01L 27/105* | (2006.01) |
| *H01L 41/29* | (2013.01) |
| *C23C 14/34* | (2006.01) |
| *H01L 41/09* | (2006.01) |
| *H01L 41/113* | (2006.01) |
| *H01L 41/45* | (2013.01) |
| *H01L 41/047* | (2006.01) |
| *H01L 41/316* | (2013.01) |

(52) U.S. Cl.
CPC ............ *H01L 41/187* (2013.01); *C01G 33/00* (2013.01); *C23C 14/34* (2013.01); *H01L 27/105* (2013.01); *H01L 41/0477* (2013.01); *H01L 41/09* (2013.01); *H01L 41/113* (2013.01); *H01L 41/1873* (2013.01); *H01L 41/29* (2013.01); *H01L 41/45* (2013.01); *H01L 41/316* (2013.01)

(58) Field of Classification Search
CPC ..... H01L 41/184; H01L 41/45; H01L 41/113; H01L 41/09; C23C 14/34

USPC ......................................................... 524/113
See application file for complete search history.

(56) References Cited

U.S. PATENT DOCUMENTS

| | | | |
|---|---|---|---|
| 6,347,862 B1 | 2/2002 | Kanno et al. | |
| 2002/0003123 A1 | 1/2002 | Lee et al. | |
| 2005/0082584 A1* | 4/2005 | Hussein ............ | H01L 21/28291 257/295 |
| 2007/0103038 A1 | 5/2007 | Kamijo | |
| 2008/0284543 A1 | 11/2008 | Taniguchi et al. | |
| 2010/0141099 A1* | 6/2010 | Suenaga ............... | H01L 41/047 310/365 |
| 2010/0320871 A1 | 12/2010 | Suenaga et al. | |
| 2011/0079883 A1 | 4/2011 | Shimada et al. | |
| 2011/0261120 A1 | 10/2011 | Shimizu et al. | |
| 2012/0025667 A1 | 2/2012 | Horikiri et al. | |
| 2012/0056508 A1 | 3/2012 | Horikiri et al. | |
| 2012/0236081 A1 | 9/2012 | Nakayama et al. | |
| 2012/0304429 A1 | 12/2012 | Horikiri et al. | |
| 2013/0038176 A1 | 2/2013 | Horikiri et al. | |
| 2014/0284302 A1 | 9/2014 | Hahiro | |
| 2014/0322523 A1 | 10/2014 | Abbott, Jr. et al. | |

(Continued)

FOREIGN PATENT DOCUMENTS

| | | |
|---|---|---|
| EP | 2 843 723 A1 | 3/2015 |
| JP | 10-286953 A | 10/1998 |

(Continued)

OTHER PUBLICATIONS

International Search Report, issued in PCT/JP2016/056420, PCT/ISA/210, dated May 24, 2016.

(Continued)

*Primary Examiner* — Hui H Chin
(74) *Attorney, Agent, or Firm* — Birch, Stewart, Kolasch & Birch, LLP

(57) ABSTRACT

There is provided a ferroelectric thin-film laminated substrate, including a substrate, and further including a lower electrode layer, a ferroelectric thin-film layer, an upper electrode intermediate layer, and an upper electrode layer being sequentially stacked on the substrate, in which: the lower electrode layer is made of platinum or a platinum alloy; the ferroelectric thin-film layer is made of a sodium potassium niobate (typical chemical formula of $(K_{1-x}Na_x)NbO_3$, $0.4 \leq x \leq 0.7$); the upper electrode layer is made of aluminum or an aluminum alloy; the upper electrode intermediate layer is made of a metal that has less oxidizability than titanium and can generate an intermetallic compound with Aluminum; and a part of the upper electrode intermediate layer and a part of the upper electrode layer are alloyed.

8 Claims, 1 Drawing Sheet

(56) References Cited

U.S. PATENT DOCUMENTS

| | | |
|---|---|---|
| 2014/0339962 A1 | 11/2014 | Furukawa et al. |
| 2015/0380637 A1 | 12/2015 | Jiang et al. |
| 2016/0027996 A1 | 1/2016 | Fujii et al. |
| 2018/0114896 A1 | 4/2018 | Horikiri et al. |

FOREIGN PATENT DOCUMENTS

| | | |
|---|---|---|
| JP | 2000-31133 A | 1/2000 |
| JP | 2005-142911 A | 6/2005 |
| JP | 2007-19302 A | 1/2007 |
| JP | 2010-161330 A | 7/2010 |
| JP | 2011-192736 A | 9/2011 |
| JP | 2011-235501 A | 11/2011 |
| JP | 2012-33693 A | 2/2012 |
| JP | 2012-59760 A | 3/2012 |
| JP | 2012-59851 A | 3/2012 |
| JP | 2012-59852 A | 3/2012 |
| JP | 2013-16776 A | 1/2013 |
| JP | 2013-38322 A | 2/2013 |
| JP | 2013-102089 A | 5/2013 |
| JP | 2013-225608 A | 10/2013 |
| JP | 2014-56988 A | 3/2014 |
| JP | 2014-60267 A | 4/2014 |
| JP | 2014-184643 A | 10/2014 |
| JP | 2014-187094 A | 10/2014 |
| JP | 2014-203839 A | 10/2014 |
| JP | 2014-207393 A | 10/2014 |
| JP | 2015-24663 A | 2/2015 |
| JP | 2015-53417 A | 3/2015 |
| WO | WO 2014/162998 A1 | 10/2014 |

OTHER PUBLICATIONS

Japanese Office Action, dated Jan. 8, 2019, for Japanese Application No. 2015-064739, with an English machine translation.

European Patent Office Communication and extended search report issued in the European Patent Application No. 16772062.2 dated Oct. 1, 2018.

Extended European Search Report dated Oct. 1, 2018 for Application No. 16768326.7.

European Patent Office Communication and extended search report issued in the European Patent Application No. 16746410.6 dated Aug. 30, 2018.

European Patent Office Communication and extended search report issued in the European Patent Application No. 16768322.6 dated Aug. 24, 2018.

European Patent Office Communication and extended search report issued in the European Patent Application No. 16768324.2 dated Aug. 24, 2018.

European Patent Office Communication and extended search report issued in the European Patent Application No. 16768627.8 dated Aug. 27, 2018.

Horikiri et al., "The Wet Etching Technique of KNN films by EDTA," The 61st JSAP Spring Meeting 2014, Mar. 3, 2014, p. 06-010.

International Search Report (Form PCT/ISA/210) for International Application No. PCT/JP2016/056430, dated May 24, 2016.

International Search Report (Form PCT/ISA/210) for International Application No. PCT/JP2016/056447, dated May 17, 2016.

International Search Report (Form PCT/ISA/210) for International Application No. PCT/JP2016/056452, dated May 31, 2016.

Minh et al., "A New Lead-Free (K,Na)NbO3 Piezoelectric Material and Its Microfabrication for Micro Energy Harvester", PowerMEMS 2011, Proceedings Power MEMS, Nov. 15, 2011, pp. 237-240 (4 pages total).

Japanese Office Action, dated Mar. 19, 2019, for Japanese Application No. 2015-064704, with an English machine translation.

Japanese Office Action, dated Mar. 19, 2019, for Japanese Application No. 2015-064726, with an English machine translation.

* cited by examiner

FERROELECTRIC THIN-FILM LAMINATED SUBSTRATE, FERROELECTRIC THIN-FILM DEVICE, AND MANUFACTURING METHOD OF FERROELECTRIC THIN-FILM LAMINATED SUBSTRATE

TECHNICAL FIELD OF THE INVENTION

The present invention relates to a ferroelectric thin-film device, and more particularly to a ferroelectric thin-film laminated substrate having lead-free niobate-based ferroelectrics, a ferroelectric thin-film device cut out of the thin-film laminated substrate, and a method for manufacturing the thin-film laminated substrate.

DESCRIPTION OF BACKGROUND ART

Ferroelectrics are very attractive substances because of their peculiar characteristics (such as very high relative permittivity, and good pyroelectric, piezoelectric and ferroelectric properties). So, various devices (such as ceramic multilayer capacitors, pyroelectric devices, piezoelectric devices and ferroelectric memories) have been developed and put into use utilizing such peculiar properties. Typical ferroelectrics are perovskite materials such as barium titanate ($BaTiO_3$) and lead zirconate titanate ($Pb(Zr_{1-x}Ti_x)O_3$, PZT). Of these, lead zirconate titanates (PZTs) provide relatively excellent polarization and piezoelectric properties and are therefore most widely used.

Lead-containing PZTs are specified hazardous substances. However, because there are currently no suitable commercially available alternative pyroelectric or piezoelectric materials, PZTs are exempt from the RoHS directive (the directive on the restriction of the use of specified hazardous substances in electrical and electronic equipment enforced by the European Union and Council of Europe). However, with the growing worldwide responsibility towards global environment conservation, a strong demand exists for development of pyroelectric and piezoelectric devices using lead-free ferroelectric materials.

Also, with the recent trend toward smaller and lighter electronic devices, there is an increasing need for ferroelectric thin-film devices in which a thin-film technology is utilized.

Herein, pyroelectric and piezoelectric thin-film devices will be described below as representatives of such ferroelectric thin-film devices. Piezoelectric devices utilize the piezoelectric effect of a ferroelectric material, and are widely used as functional devices such as actuators and stress sensors. Actuators generate a displacement or vibration in response to an applied voltage to a ferroelectric (piezoelectric) material. Stress sensors generate a voltage in response to a strain produced in a piezoelectric material. Pyroelectric devices detect light (including infrared light) utilizing the pyroelectric effect of a ferroelectric material, and are widely used as infrared human body sensors, etc.

Examples of piezoelectric devices utilizing a lead-free piezoelectric material are described below. Patent Literature 1 discloses a piezoelectric thin-film device including, on a substrate, a lower electrode, a piezoelectric thin-film and an upper electrode. The piezoelectric thin-film is made of an alkali niobate-based perovskite dielectric material of a chemical formula ($Na_xK_yLi_z)NbO_3$ (where $0<x<1$, $0<y<1$, $0 \leq z<1$, and $x+y+z=1$). A buffer layer of a perovskite crystal structure material is formed between the piezoelectric thin-film and the lower electrode. The perovskite buffer layer is highly preferentially (001), (100), (010) or (111) oriented.

According to this Patent Literature 1, the piezoelectric thin-film device utilizing the lead-free lithium potassium sodium niobate thin-film exhibits sufficient piezoelectric properties.

Patent Literature 2 discloses a piezoelectric thin-film device at least having an adhesive layer, a lower electrode layer, and a lead-free piezoelectric thin-film layer, which are sequentially stacked on a substrate. The lead-free piezoelectric thin-film layer is made of a lithium potassium sodium niobate (chemical formula of $(Na_xK_yLi_z)NbO_3$, $0<x<1$, $0<y<1$, $0 \leq z<1$, $x+y+z=1$); the adhesive layer is made of an oxide of Group 4 element or an oxide of Group 5 element; and the adhesive layer has a thickness of 1 nm or more but 2 nm or less. According to Patent Literature 2, a lead-free piezoelectric thin-film device having high piezoelectric properties and a small variation in piezoelectric properties for each device can be provided.

CITATION LIST

Patent Literature

Patent Literature 1: JP 2007-019302 A
Patent Literature 2: JP 2014-207393 A

SUMMARY OF THE INVENTION

Problems to be Solved by the Invention

As mentioned above, niobate-system ferroelectrics (such as a potassium sodium niobate, typical chemical formula: $(K_{1-x}Na_x)NbO_3$) are among particularly promising materials as lead-free ferroelectrics. However, because niobate-based ferroelectric materials are relatively new materials, lamination structures of thin-film devices and manufacturing processes thereof are still under development. In order to put such thin-film devices using niobate-based ferroelectric materials as alternatives for PZT thin-film devices to practical use and mass production, it is very important to develop and establish the lamination structures and manufacturing processes of the thin-film devices.

Furthermore, cost reduction is one of the high-priority issues in the field of electronic components such as a thin-film device, and a technique of reducing costs while maintaining the performance and property of an electronic component is also very important. A review of conventional art from a cost reduction standpoint shows that, for example, the piezoelectric thin-film devices described in Patent Literatures 1 and 2 use platinum (Pt) or a Pt alloy as a lower electrode, and use Pt or gold (Au) as an upper electrode. So, a change of material may reduce the costs.

According to a detailed study of the prior art by the present inventors, it is considered that simple changing a material of the lower electrode would be improper because the lower electrode also serves as an underlying layer for the formation of the ferroelectric layer and is closely associated with the crystal orientation or ferroelectricity of the ferroelectric layer. By contrast, it is considered that the upper electrode, which is stacked after the formation of the ferroelectric layer, has a relatively small influence on the crystal orientation or ferroelectricity of the ferroelectric layer.

Then, the inventors carried out further studies on the case where the material of the upper electrode was changed to aluminum (Al), which is lower in material cost, with reference to the technique of Patent Literature 2. As a result, there occurred a problem that the ferroelectricity of the thin-film device was reduced contrary to expectation (details are described later). In other words, it is found that a simple change of material was inappropriate even with respect to the upper electrode, which is stacked after the formation of the ferroelectric layer, of the niobate-based ferroelectric thin-film device.

In view of the foregoing, it is an objective of the present invention to provide a niobate-based ferroelectric thin-film laminated substrate that can solve the aforementioned problem to reduce the costs while maintaining the performance and property as a thin-film device, a ferroelectric thin-film device cut out of the thin-film laminated substrate, and a method for manufacturing the thin-film laminated substrate.

Solution to Problems (I) According to one aspect of the present invention, there is provided a ferroelectric thin-film laminated substrate, including a substrate, and further including a lower electrode layer, a ferroelectric thin-film layer, an upper electrode intermediate layer, and an upper electrode layer, which are sequentially stacked on the substrate. In the ferroelectric thin-film laminated substrate, the lower electrode layer is made of platinum (Pt) or a Pt alloy; the ferroelectric thin-film layer is made of a sodium potassium niobate (typical chemical formula of $(K_{1-x}Na_x)NbO_3$, $0.4 \le x \le 0.7$); the upper electrode layer is made of aluminum (Al) or an Al alloy; the upper electrode intermediate layer is made of a metal which has less oxidizability than titanium and can generate an intermetallic compound with aluminum; and a part of the upper electrode intermediate layer and a part of the upper electrode layer are alloyed. It is noted that alloying in the present invention is defined to involve generation of an intermetallic compound.

In the above aspect (I) of the invention, the following modifications and changes can be made.

(i) The upper electrode intermediate layer may be made of one selected from nickel (Ni), cobalt (Co), tungsten (W), and molybdenum (Mo).

(ii) The upper electrode intermediate layer may have a thickness of 2 nm or more but 50 nm or less.

(iii) A lower electrode adhesive layer may be further stacked between the substrate and the lower electrode layer, the lower electrode adhesive layer being made of titanium (Ti) and/or a Ti oxide.

(iv) The lower electrode layer may have a main surface with a (111) crystal plane preferential orientation; and the ferroelectric thin-film layer may have a crystal system of a pseudo cubic system or a tetragonal system, and a main surface with a (011) crystal plane preferential orientation.

(v) The substrate may be a silicon substrate having a thermally oxidized film on its surface.

(II) According to another aspect of the invention, there is provided a ferroelectric thin-film device characterized by using the ferroelectric thin-film laminated substrate of the invention described above.

(III) According to still another aspect of the invention, there is provided a manufacturing method of the ferroelectric thin-film laminated substrate of the invention described above. The manufacturing method includes: a lower electrode layer formation step of forming the lower electrode layer on the substrate; a ferroelectric thin-film layer formation step of forming the ferroelectric thin-film layer on the lower electrode layer; an upper electrode intermediate layer formation step of forming the upper electrode intermediate layer on the ferroelectric thin-film layer; and an upper electrode layer formation step of forming the upper electrode layer on the upper electrode intermediate layer. The upper electrode layer formation step includes a process of depositing the upper electrode layer under a temperature environment of 50° C. or more but 200° C. or less to alloy a part of the upper electrode intermediate layer with a part of the upper electrode layer.

Advantages of the Invention

According to the present invention, it is possible to provide a niobate-based ferroelectric thin-film laminated substrate that can reduce the costs while maintaining the performance and property as a thin-film device, a ferroelectric thin-film device cut out of the thin-film laminated substrate, and a method for manufacturing the thin-film laminated substrate.

DETAILED DESCRIPTION OF THE PREFERRED EMBODIMENTS

The present inventors have focused on a sodium potassium niobate (typical chemical formula of $(K_{1-x}Na_x)NbO_3$, $0.4 \le x \le 0.7$; hereinafter referred to as KNN) as a lead-free ferroelectric material that can be expected to exhibit a ferroelectricity comparable to that of a PZT (typical chemical formula: $Pb(Zr_{1-x}Ti_x)O_3$), and have conducted research and development with an aim to put KNN thin film devices into practical use. In the research and development, the inventors carried out various investigations on the use of Al as a material of the upper electrode for a reduction in cost of the KNN thin-film device. As described above, there occurred a problem that the ferroelectricity of the KNN thin-film device was reduced contrary to expectation.

Therefore, intensive investigations on the laminated structure of the upper electrode being capable of both maintaining the performance and property as the thin-film device and reducing the costs were further conducted. As a result, it is found that the above can be achieved when a metal that has less oxidizability than Ti and can form an intermetallic compound with Al is used as the upper electrode intermediate layer formed between the ferroelectric thin-film layer and the upper electrode layer. The present invention has been made on the basis of this new finding.

Preferred embodiments of the invention will be described below with reference to the accompanying drawings. However, the invention is not limited to the specific embodiments described below, but various combinations and modifications are possible without departing from the spirit and scope of the invention.

Figure 1:
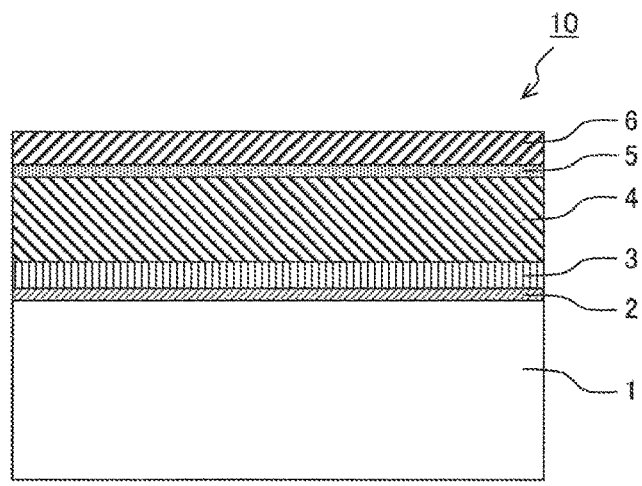
FIG. 1 is a schematic illustration showing a cross-sectional view of a ferroelectric thin-film laminated substrate according to the present invention.

FIG. 1 is a schematic illustration showing a cross-sectional view of a ferroelectric thin-film laminated substrate according to the invention. As illustrated in FIG. 1, a ferroelectric thin-film laminated substrate 10 of the invention has a structure in which on a substrate 1, a lower electrode adhesive layer 2, a lower electrode layer 3, a ferroelectric thin-film layer 4, an upper electrode intermediate layer 5, and an upper electrode layer 6 are stacked in this order. The ferroelectric thin-film device according to the invention can be obtained as a chip with a desired shape by cutting out of the ferroelectric thin-film laminated substrate 10 of the invention. Meanwhile, the upper electrode intermediate layer 5 and the upper electrode layer 6 may be formed at the stage of the ferroelectric thin-film laminated substrate 10 or may be formed after the device is cut out into a desired shaped chip.

A detailed description is given in accordance with a procedure of manufacturing the ferroelectric thin-film laminated substrate 10.

First, a substrate 1 is prepared. A material of the substrate 1 is not particularly limited, and may be properly selected based on applications of the ferroelectric thin-film devices. For example, silicon (Si), SOI (Silicon on Insulator), quartz glass, gallium arsenide (GaAs), gallium nitride (GaN), sapphire ($Al_2O_3$), magnesium oxide (MgO), zinc oxide (ZnO), and strontium titanate ($SrTiO_3$) may be used. From the view point of cost, using Si substrates is preferable among these materials. When an electrically conductive material is used as the substrate 1, its surface is preferably covered with an electrical insulating film (e.g. an oxide film). There is no particular limitation on a method of forming the oxide film. For example, thermal oxidation and chemical vapor deposition (CVD) are suitable.

Next, the lower electrode adhesive layer 2 is formed on the substrate 1. Although the formation of the lower electrode adhesive layer 2 is not essential, the lower electrode adhesive layer 2 is preferably formed in order to increase adhesiveness between the substrate 1 and the lower electrode layer 3. Furthermore, it is preferable in terms of adhesiveness or environmental resistance that the material of the lower electrode adhesive layer 2 is, e.g., Ti and/or a Ti oxide having a thickness of 1 to 3 nm. Ti is an easy oxidability metal (meaning a metal that oxidizes easily; a metal having a small ionization potential, e.g., first ionization potential), which tends to bind to an oxygen atom present on a surface of the substrate 1 into the form of a titanium oxide (atomic bond state), so that high adhesiveness can be secured. There is no particular limitation on a method of forming the lower electrode adhesive layer 2. For example, the lower electrode adhesive layer 2 is formed preferably by a physical vapor deposition method such as sputtering, thermal evaporation, and electron beam evaporation.

Next, a lower electrode layer 3 is formed on the lower electrode adhesive layer 2. As a material of the lower electrode layer 3, Pt or a Pt alloy (alloy containing mainly platinum) is preferable. The lower electrode layer 3 is an underlayer of a ferroelectric thin-film layer 4, and then in order to improve crystal orientation of the ferroelectric thin-film layer 4, the lower electrode layer 3 preferably has a main surface with one of a (001) crystal plane, a (110) crystal plane, and a (111) crystal plane preferential orientation. Furthermore, the lower electrode layer 3 preferably has a crystal texture consisting of columnar crystal grains. There is no particular limitation on a method for forming the lower electrode layer 3. For example, the lower electrode layer 3 is formed preferably by a physical vapor deposition method such as sputtering, thermal evaporation, and electron beam evaporation.

Next, the ferroelectric thin-film layer 4 is formed on the lower electrode layer 3. In the present invention, a lead-free ferroelectric of a sodium potassium niobate (typical chemical formula of $(K_{1-x}Na_x)NbO_3$, $0.4 \leq x \leq 0.7$; referred to as KNN) is preferable as a material of the ferroelectric thin-film layer 4. In order to achieve sufficient ferroelectric performance, a crystal system of the ferroelectric thin-film layer 4 is preferably a pseudo cubic system or a tetragonal system; and the ferroelectric thin-film layer 4 preferably has a main surface with a (001) crystal plane preferential orientation.

There is no particular limitation on a method for forming the ferroelectric thin-film layer 4 (KNN thin-film) as long as a desired KNN thin-film layer is obtained. Preferable formation methods include sputtering using a sintered body target having a desired chemical composition, electron beam evaporation, and pulsed laser deposition. These formation methods have advantages of excellent chemical composition controllability and crystal orientation controllability of the KNN crystal.

The KNN thin-film layer 4 may contain one or more selected from lithium (Li), tantalum (Ta), antimony (Sb), calcium (Ca), copper (Cu), barium (Ba) and Ti in a total amount of 5 atomic percent or less.

Next, an upper electrode intermediate layer 5 is formed on the ferroelectric thin-film layer 4. The upper electrode intermediate layer 5 plays both a role of increasing adhesiveness between the ferroelectric thin-film layer 4 and the upper electrode layer 6 (role of an adhesive layer) and a role of suppressing diffusion of a constituent of an upper electrode layer 6 to the ferroelectric thin-film layer 4 (role of a diffusion barrier). The present invention is best characterized by a combination of the upper electrode intermediate layer 5 and the upper electrode layer 6.

The material of the upper electrode intermediate layer 5 is preferably a metal that has less oxidizability (meaning a metal that hardly oxidizes; a metal having a larger ionization potential, e.g., first ionization potential) than Ti and can generate an intermetallic compound with Al. For example, one selected from Ni, Co, W and Mo is preferably used. These metals are more resistant to oxidation than Ti. Therefore, the percentage (probability) of generating an oxide during deposition is sufficiently small. For example, it is considered that an atomic bond state with respect to oxygen is generated only in an interface region between the ferroelectric thin-film layer 4 and the upper electrode intermediate layer 5.

The aforementioned metals (Ni, Co, W and Mo) can generate an intermetallic compound with Al. Therefore, it is considered that during deposition of an upper electrode layer in a subsequent process, the metals are alloyed with Al of the upper electrode layer 6 to generate an intermetallic compound. In addition, generally, the diffusion coefficient of atoms in an intermetallic compound is much smaller than that in a solid solution alloy. Therefore, diffusion of Al atoms would be suppressed. As a result, a reduction in ferroelectricity of the KNN thin-film device can be suppressed.

The upper electrode intermediate layer 5 preferably has a thickness (average film thickness) of 2 nm or more but 50 nm or less. When the thickness of the upper electrode intermediate layer 5 is less than 2 nm, an alloying reaction with Al of the upper electrode layer 6 is insufficient (shortage of the amount of intermetallic compound to be generated), resulting in an insufficient effect of suppressing Al atom diffusion. When the thickness of the upper electrode intermediate layer 5 exceeds 50 nm, the effect of suppressing Al atom diffusion is saturated, and the processing cost of micro fabrication (e.g., dry etching) of the upper electrode intermediate layer 5 and the upper electrode layer 6 increases.

Next, the upper electrode layer 6 is formed on the upper electrode intermediate layer 5. According to the invention, it is preferable from a cost reduction standpoint to use Al or an Al alloy as a material of the upper electrode layer 6. There is also no particular limitation on a method of forming the upper electrode layer 6. As in the case of the lower electrode layer 3, a physical vapor deposition method (e.g., sputtering, thermal evaporation, and electron beam evaporation) may be used preferably.

The deposition of the upper electrode layer 6 is preferably carried out under a temperature condition at 50° C. or more but 200° C. or less, more preferably at 100° C. or more but 200° C. or less. Depositing the upper electrode layer 6 at a predetermined raised temperature enables acceleration of an alloying reaction between a part of the upper electrode intermediate layer 5 and a part of the upper electrode layer 6 (generation of an intermetallic compound of the metal forming the upper electrode intermediate layer 5 and Al forming the upper electrode layer 6). When the temperature during deposition is less than 50° C., the alloying reaction is insufficient. When the temperature during deposition exceeds 200° C., the metal of the upper electrode intermediate layer 5 is prone to be oxidized and Al is diffused actively. As a result, the intermetallic compound is hardly generated, and the Al atoms can reach the ferroelectric thin-film layer 4 easily.

EXAMPLES

The present invention will be described more specifically below by way of examples. However, the invention is not limited to the specific examples below.

[Preparation of Ferroelectric Thin-Film Laminated Substrate]

On the basis of the thin-film laminated structure (substrate 1, lower electrode adhesive layer 2, lower electrode layer 3, ferroelectric thin-film layer 4, upper electrode intermediate layer 5, upper electrode layer 6) illustrated in FIG. 1, several kinds of ferroelectric thin-film laminated substrates having a different combination of the upper electrode intermediate layer 5 and the upper electrode layer 6 were produced. As the substrate 1, an Si substrate with a thermal oxide film (four-inch wafer having a (100) plane orientation, a wafer thickness of 0.525 mm, a thermal oxide film thickness of 200 nm, a substrate surface roughness Ra=0.86 nm) was used.

In the film formation steps below, the thickness of each layer (lower electrode adhesive layer 2, lower electrode layer 3, ferroelectric thin-film layer 4, upper electrode intermediate layer 5, upper electrode layer 6) was controlled by controlling the film formation time based on the film formation rate determined in advance. Also, the thickness measurement for calculation of each film formation rate was conducted by the X-ray reflectivity technique using an X-ray diffractometer (X'Pert PRO MRD, available from PANalytical B.V., Spectris Co., Ltd.).

First, a Ti layer having a thickness of 2.2 nm was deposited on the Si substrate 1 by RF magnetron sputtering as the lower electrode adhesive layer 2 to enhance adhesion between the substrate 1 and the lower electrode layer 3. Subsequently, a Pt layer having a thickness of 205 nm was deposited by RF magnetron sputtering as the lower electrode layer 3 on the Ti lower electrode adhesive layer 2. The sputtering conditions for the lower electrode adhesive layer 2 and the lower electrode layer 3 were as follows: targets of pure Ti (for the Ti adhesive layer) and pure Pt (for the Pt electrode layer); discharge power of 200 W; sputtering gas of Ar; and gas pressure of 2.5 Pa. The sputtering was carried out using a RF sputtering machine (SH-350-T10, available from ULVAC, Inc.) (the same machine was used in all the remaining sputtering processes described below). The lower electrode layer 3 was subjected to the surface roughness measurement and observed to have an arithmetic mean roughness Ra of 0.86 nm or less.

After the formation of the Pt lower electrode layer 3, a KNN (($K_{0.35}Na_{0.65}$)$NbO_3$) thin-film having a thickness of 1.9 μm was deposited by RF magnetron sputtering as the ferroelectric thin-film layer 4 on the lower electrode layer 3. The sputtering condition for the KNN thin-film 4 was as follows: target of sintered ($K_{0.35}Na_{0.65}$)$NbO_3$; substrate temperature of 400 to 600° C.; discharge power of 700 to 800 W; sputtering gas of $O_2$/Ar mixture ($O_2$/Ar ratio=0.005); and gas pressure of 0.3 to 1.3 Pa.

(Evaluation of Crystal Systems of KNN Thin-Film)

Normally, perovskite KNN crystals have a tetragonal structure in which the c-axis is longer than the a-axis (c/a>1). That is, when formed KNN crystals satisfy the crystalline condition of "c/a>1", the crystals are more stable and the crystallinity thereof is high. When an electric field is applied along the c-axis of a perovskite-type ferroelectric crystal with a small initial strain, a larger polarization (and thus a higher gain in piezoelectric or ferroelectric performance) is obtained.

On the other hand, unlike bulk crystals, thin-film crystals formed on a substrate are prone to distortion caused by the influence of the substrate or the underlayer. Specifically, the KNN thin-film formed on a substrate may have a pseudo cubic crystal system with "c/a 1" (herein meaning "a crystal system closer to a cubic system than to a proper tetragonal system") or a tetragonal crystal system with "c/a>1" (herein meaning "a crystal system closer to a proper tetragonal system"). Therefore, the crystal system of each of the KNN thin-films formed above was evaluated by X-ray diffraction (XRD). The results showed that the KNN thin-film laminated substrates, each of which was provided with the KNN thin-film mainly having a tetragonal system with "c/a>1", were obtained.

(Preparation of Reference Sample)

Next, a Ti layer having a thickness of 2 nm was deposited by RF magnetron sputtering as the upper electrode intermediate layer 5 on the KNN thin-film layer 4. Subsequently, a Pt layer having a thickness of 300 nm was deposited by RF magnetron sputtering as the upper electrode layer 6 on the Ti upper electrode intermediate layer 5. The sputtering conditions for the upper electrode intermediate layer 5 and the upper electrode layer 6 were the same as those in the cases of the lower electrode adhesive layer 2 and the lower electrode layer 3, i.e., use of a pure Ti target and a pure Pt target, discharge power of 200 W, sputtering gas of Ar, and gas pressure of 2.5 Pa. Thus, a KNN thin-film laminated substrate was produced as a reference sample of conventional art.

Preparation of Comparative Example 1

A KNN thin-film laminated substrate of Comparative Example 1 was produced in the same manner as the aforementioned reference sample, except that a Ti layer having a thickness of 2 nm was deposited by electron beam evaporation as the upper electrode intermediate layer 5 on the KNN thin-film layer 4 and then an Al layer having a thickness of 300 nm was deposited by electron beam evaporation as the upper electrode layer 6 on the Ti upper electrode intermediate layer 5. The electron beam evaporation was carried out using an electron beam evaporation machine (EX-400-008, available from ULVAC, Inc.) (the same machine was used in all the remaining electron beam evaporation processes described below).

Preparation of Example 1

An Ni layer having a thickness of 2 nm was deposited as the upper electrode intermediate layer 5 on the KNN thin-film layer 4 by electron beam evaporation, and then an Al layer having a thickness of 300 nm was deposited by electron beam evaporation as the upper electrode layer 6 on the Ni upper electrode intermediate layer 5. The depositions of the Ni layer and the Al layer were carried out at a substrate temperature of 200° C. Apart from the above, a KNN thin-film laminated substrate of Example 1 was produced in the same manner as the aforementioned reference sample.

Preparation of Examples 2 and 3

Another KNN thin-film laminated substrate as Example 2 was produced in the same manner as Example 1, except that an Ni layer having a thickness of 10 nm was deposited by electron beam evaporation as the upper electrode intermediate layer 5 on the KNN thin-film layer 4. On the other hand, another KNN thin-film laminated substrate as Example 3 was produced in the same manner as Example 1, except that an Ni layer having a thickness of 50 nm was deposited by electron beam evaporation as the upper electrode intermediate layer 5 on the KNN thin-film layer 4.

Preparation of Examples 4 to 6

Another KNN thin-film laminated substrate as Example 4 was produced in the same manner as Example 1, except that a Co layer having a thickness of 2 nm was deposited by electron beam evaporation as the upper electrode intermediate layer 5 on the KNN thin-film layer 4. Another KNN thin-film laminated substrate as Example 5 was produced in the same manner as Example 1, except that a W layer having a thickness of 2 nm was deposited by electron beam evaporation as the upper electrode intermediate layer 5 on the KNN thin-film layer 4. In addition, another KNN thin-film laminated substrate as Example 6 was produced in the same manner as Example 1, except that an Mo layer having a thickness of 2 nm was deposited by electron beam evaporation as the upper electrode intermediate layer 5 on the KNN thin-film layer 4.

[Preparation of Ferroelectric Thin-Film Device]

Small pieces (20 mm×20 mm) were cut out of the KNN thin-film laminated substrates of the aforementioned reference sample, Comparative Example 1 and Examples 1 to 6 to produce measurement/evaluation KNN thin-film devices of the reference sample, Comparative Example 1, and Examples 1 to 6.

[Evaluation of Characteristics of Ferroelectric Thin-Film Device]

Figure 2:
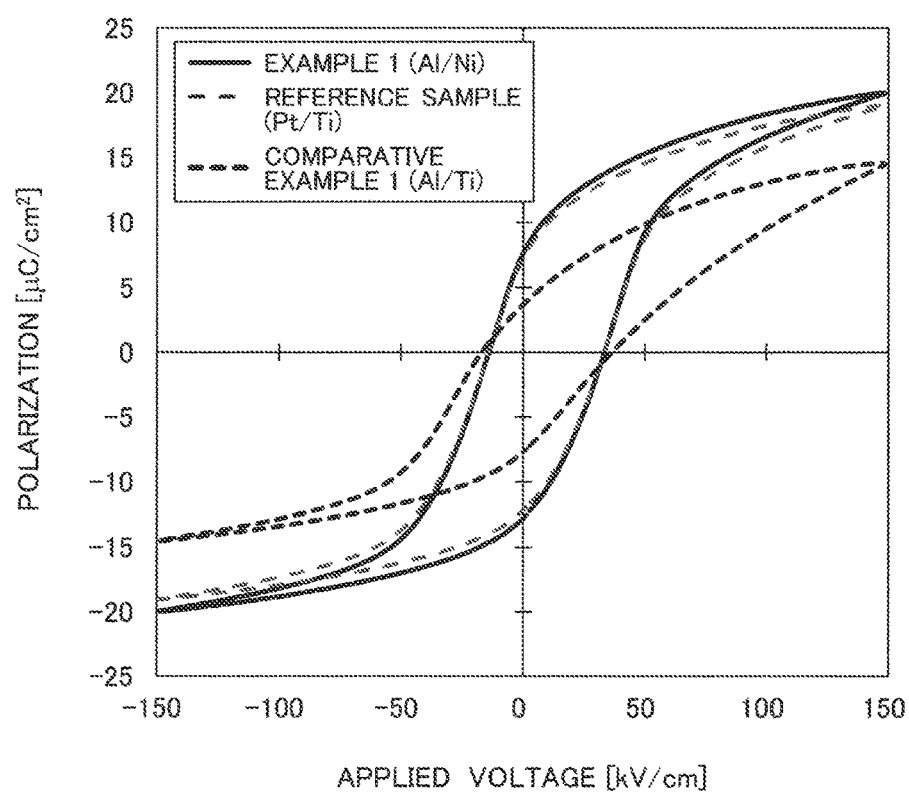
FIG. 2 is a graph showing exemplary relationships between polarization value and applied voltage with respect to KNN thin-film devices of Reference Sample, Comparative Example 1 and Example 1.

The obtained KNN thin-film devices were measured for the polarization using a ferroelectric characteristics analyzer. FIG. 2 is a graph showing exemplary relationships between polarization value and applied voltage with respect to the KNN thin-film devices of Reference Sample, Comparative Example 1 and Example 1.

As shown in FIG. 2, according to a comparison between Reference Sample (upper electrode layer/upper electrode intermediate layer=Pt/Ti) and Comparative Example 1 (upper electrode layer/upper electrode intermediate layer=Al/Ti), it is found that the polarization property (hysteresis loop of polarization value) of Comparative Example 1 is more deteriorated than that of Reference Sample. Given the above, it is confirmed that a simple change of material was inappropriate even with respect to the upper electrode of the KNN thin-film device. With Example 1 (upper electrode layer/upper electrode intermediate layer=Al/Ni) according to the present invention, it is confirmed that the polarization property thereof was almost identical to the polarization property of Reference Sample and was substantially unchanged.

The difference between Comparative Example 1 and Example 1 is discussed briefly. Both the Al—Ti combination (Al—Ti system) of Comparative Example 1 and the Al—Ni combination (Al—Ni system) of Example 1 are an alloy system that can generate an intermetallic compound with reference to their phase equilibrium diagrams.

Herein, the Ti is an easy oxidability metal, and the Ti layer, which is the upper electrode intermediate layer 5, is deposited on the KNN thin-film layer, which is an oxide. Therefore, it is considered that the Ti layer of the upper electrode intermediate layer 5 tends to generate a Ti oxide. Furthermore, because the Ti oxide is a chemically very stable phase, an alloying reaction (generation of an intermetallic compound) would be hard to occur during the deposition of the Al layer, which is the upper electrode layer 6. As a result, it is considered that a diffusion barrier by means of the upper electrode intermediate layer 5 did not work sufficiently, resulting in degradation of polarization property.

By contrast, the Ni is a metal that has less oxidizability than the Ti. Therefore, the percentage (probability) of generating an Ni oxide during the deposition of the upper electrode intermediate layer 5 would be sufficiently small. Therefore, it is considered that an alloying reaction (generation of an intermetallic compound) sufficiently occurred during the deposition of the Al layer of the upper electrode layer 6, and the upper electrode intermediate layer 5 worked as a diffusion barrier.

Regarding the thickness of the upper electrode intermediate layer 5, it was separately confirmed that equivalent results were obtained from Examples 1 to 3. In addition, regarding the type of metal forming the upper electrode intermediate layer 5, it was separately confirmed that results equivalent to those of Example 1 were obtained from Examples 4 to 6.

The above embodiments and examples of the invention as well as the appended claims and figures show multiple characterizing features of the invention in specific combinations. The skilled person will easily be able to consider further combinations or sub-combinations of these features in order to adapt the invention as defined in the claims to his specific needs.

LEGEND

1 . . . substrate;
2 . . . lower electrode adhesive layer;
3 . . . lower electrode layer;
4 . . . ferroelectric thin-film layer;
5 . . . upper electrode intermediate layer;
6 . . . upper electrode layer; and
10 . . . ferroelectric thin-film laminated substrate.

The invention claimed is:

1. A ferroelectric thin-film laminated substrate, comprising a substrate, and further comprising a lower electrode layer, a ferroelectric thin-film layer, an upper electrode intermediate layer, and an upper electrode layer being sequentially stacked on the substrate, wherein:

the lower electrode layer is made of platinum or a platinum alloy;

the ferroelectric thin-film layer is made of a sodium potassium niobate with the chemical formula $(K_{1-x}Na_x)NbO_3$, $0.4 \leq x \leq 0.7$;

the upper electrode layer is made of aluminum or an aluminum alloy;

the upper electrode intermediate layer is made of a metal that has less oxidizability than titanium and can generate an intermetallic compound with aluminum; and a part of the upper electrode intermediate layer and a part of the upper electrode layer are alloyed to generate the intermetallic compound.

2. The ferroelectric thin-film laminated substrate according to claim 1, wherein the upper electrode intermediate layer is made of one selected from nickel, cobalt, tungsten, and molybdenum.

3. The ferroelectric thin-film laminated substrate according to claim 1, wherein the upper electrode intermediate layer has a thickness of 2 nm or more but 50 nm or less.

4. The ferroelectric thin-film laminated substrate according to claim 1, wherein:

a lower electrode adhesive layer is further stacked between the substrate and the lower electrode layer; and the lower electrode adhesive layer is made of titanium and/or a titanium oxide.

5. The ferroelectric thin-film laminated substrate according to claim 1, wherein:

the lower electrode layer has a main surface with a (111) crystal plane preferential orientation; and the ferroelectric thin-film layer has a crystal system of a pseudo cubic system or a tetragonal system, and has a main surface with a (011) crystal plane preferential orientation.

6. The ferroelectric thin-film laminated substrate according to claim 1, wherein the substrate is a silicon substrate having a thermally oxidized film on its surface.

7. A ferroelectric thin-film device using the ferroelectric thin-film laminated substrate according to claim 1.

8. A manufacturing method of a ferroelectric thin-film laminated substrate comprising a substrate, and further comprising a lower electrode layer, a ferroelectric thin-film layer, an upper electrode intermediate layer, and an upper electrode layer being sequentially stacked on the substrate, wherein:

the lower electrode layer is made of platinum or a platinum alloy;

the ferroelectric thin-film layer is made of a sodium potassium niobate with the chemical formula $(K_{1-x}Na_x)NbO_3$, $0.4 \leq x \leq 0.7$;

the upper electrode layer is made of aluminum or an aluminum alloy;

the upper electrode intermediate layer is made of a metal that has less oxidizability than titanium and can generate an intermetallic compound with aluminum; and a part of the upper electrode intermediate layer and a part of the upper electrode layer are alloyed to generate the intermetallic compound, wherein the manufacturing method comprising:

a lower electrode layer formation step of forming the lower electrode layer on the substrate;

a ferroelectric thin-film layer formation step of forming the ferroelectric thin-film layer on the lower electrode layer;

an upper electrode intermediate layer formation step of forming the upper electrode intermediate layer on the ferroelectric thin-film layer; and an upper electrode layer formation step of forming the upper electrode layer on the upper electrode intermediate layer, wherein the upper electrode layer formation step includes a process of depositing the upper electrode layer under a temperature environment of 50° C. or more but 200° C. or less to alloy a part of the upper electrode intermediate layer with a part of the upper electrode layer.

* * * * *